United States Patent [19]

Muka

[11] Patent Number: 5,588,827
[45] Date of Patent: Dec. 31, 1996

[54] PASSIVE GAS SUBSTRATE THERMAL CONDITIONING APPARATUS AND METHOD

[75] Inventor: Richard S. Muka, Topsfield, Mass.

[73] Assignee: Brooks Automation Inc., Chelmsford, Mass.

[21] Appl. No.: 480,128

[22] Filed: Jun. 7, 1995

Related U.S. Application Data

[63] Continuation-in-part of Ser. No. 169,432, Dec. 17, 1993.

[51] Int. Cl.⁶ .............................. F27B 5/04; F27D 7/02; F27D 9/00
[52] U.S. Cl. ........................ 432/5; 432/205; 432/241; 432/253
[58] Field of Search ........................ 432/4, 5, 6, 156, 432/205, 241, 253, 259

[56] References Cited

U.S. PATENT DOCUMENTS

| | | | |
|---|---|---|---|
| 3,935,646 | 2/1976 | Grandine et al. | 34/92 |
| 4,261,762 | 4/1981 | King | 148/1.5 |
| 4,367,114 | 1/1983 | Steinberg et al. | 156/345 |
| 4,381,965 | 5/1983 | Maher, Jr. et al. | 156/345 |
| 4,490,111 | 12/1984 | Yakura | 432/205 |
| 4,534,816 | 8/1985 | Chen et al. | 156/345 |
| 4,544,446 | 10/1985 | Cady | 156/639 |
| 4,597,736 | 7/1986 | Moffat | 432/26 |
| 4,666,366 | 5/1987 | Davis | 414/749 |
| 4,680,061 | 7/1987 | Lamont, Jr. | 148/1.5 |
| 4,715,812 | 12/1987 | Von Matuschka et al. | 432/258 |
| 4,715,921 | 12/1987 | Maher et al. | 156/345 |
| 4,721,462 | 1/1988 | Collins, Jr. | 432/253 |
| 4,770,630 | 9/1988 | Akimoto et al. | 432/121 |
| 4,778,382 | 10/1988 | Sakashita | 432/6 |
| 4,838,978 | 6/1989 | Sekine et al. | 156/345 |
| 4,909,701 | 3/1990 | Hardegen et al. | 414/749 |
| 4,925,388 | 5/1990 | Iseki et al. | 432/205 |
| 4,951,601 | 8/1990 | Maydan et al. | 118/719 |
| 5,009,738 | 4/1991 | Gruenwald et al. | 156/345 |
| 5,013,385 | 5/1991 | Maher et al. | 156/345 |
| 5,060,354 | 10/1991 | Chizinsky | 29/25.02 |
| 5,090,900 | 2/1992 | Rudolf et al. | 432/239 |
| 5,180,276 | 1/1993 | Hendrickson | 414/752 |
| 5,183,402 | 2/1993 | Cooke et al. | 432/5 |
| 5,199,483 | 4/1993 | Bahng | 165/1 |
| 5,252,807 | 10/1993 | Chizinsky | 219/390 |
| 5,304,279 | 4/1994 | Coultas et al. | 156/345 |
| 5,429,498 | 7/1995 | Okase et al. | 432/6 |
| 5,431,700 | 7/1995 | Sloan | 432/241 |
| 5,447,431 | 9/1995 | Muka | 431/4 |

OTHER PUBLICATIONS

"Building Construction Handbook", by Merritt, McGraw-Hill Book Company, New York, 1958, pp. 8-3:8-4, Jan. 1958.

"Introduction To Theoretical Physics" by Page, D. Van Nostrand Company, New York, pp. 351-353. (No Date Provided).

"University Chemistry" by Mahan, Addison-Wesley Publishing Co., Reading, Massachusetts, pp. 66-70. (No Date Provided).

*Primary Examiner*—Willis R. Wolfe
*Attorney, Agent, or Firm*—Perman & Green

[57] ABSTRACT

A substrate thermal conditioning apparatus with a chamber, a plate located in the chamber and a gas supply. The plate has a top heat transfer surface with grooves therealong. A substrate is placed on standoffs of the heat transfer surface and gas is pumped into the chamber. The plate is either heated or cooled to change the temperature of the substrate. Heat is transferred between the substrate and the plate primarily by gas conduction heating. Because of the grooves in the plate, the gas can be very quickly and uniformly distributed and evacuated between the substrate and the heat transfer surface.

12 Claims, 3 Drawing Sheets

5,588,827

PASSIVE GAS SUBSTRATE THERMAL CONDITIONING APPARATUS AND METHOD

CROSS-REFERENCE TO RELATED APPLICATION

This is a continuation-in-part patent application of U.S. application Ser. No. 08/169,432 filed Dec. 17, 1993, pending.

BACKGROUND OF THE INVENTION

1. Field of the Invention

This invention relates to an apparatus and method for heating a substrate and, more particularly, to an apparatus and method for use with planar objects such as semiconductor wafers and flat panels.

2. Prior Art

U.S. Pat. Nos. 5,060,354; 5,252,807 and 4,597,736 disclose thermal processors for semiconductor wafers. U.S. Pat. No. 4,534,816 discloses a single wafer plasma etch reactor. U.S. Pat. No. 5,013,385 discloses a system with multiple single wafer plasma reactors.

SUMMARY OF THE INVENTION

In accordance with one embodiment of the present invention an apparatus for changing temperature of a substrate is provided. The apparatus comprises a chamber, a plate, means for introducing a gas into the chamber, and means for heating the plate. The plate is located in the chamber. The plate has a top surface with grooves therealong. Heat is transferred between the plate and the substrate located on standoffs on the top surface by the gas conduction.

In accordance with another embodiment of the present invention, in an apparatus for changing temperature of a planar substrate, the apparatus having a substrate receiving chamber, a plate located in the chamber having a heat transfer surface, and means for controlling the temperature of the plate, the improvement comprises the heat transfer surface of the plate having grooves therealong to quickly distribute gas between the plate and the substrate located on the plate.

In accordance with one method of the present invention a method of transferring heat from a planar substrate and a plate in a thermal conditioning apparatus is provided comprising steps of placing the substrate on the plate in a chamber of the apparatus, the plate having a heat transfer surface with grooves therealong; introducing gas into the chamber; and transferring heat between the plate and the substrate by gas conduction.

BRIEF DESCRIPTION OF THE DRAWINGS

The foregoing aspects and other features of the invention are explained in the following description, taken in connection with the accompanying drawings, wherein.

DETAILED DESCRIPTION OF THE INVENTION

Figure 1:
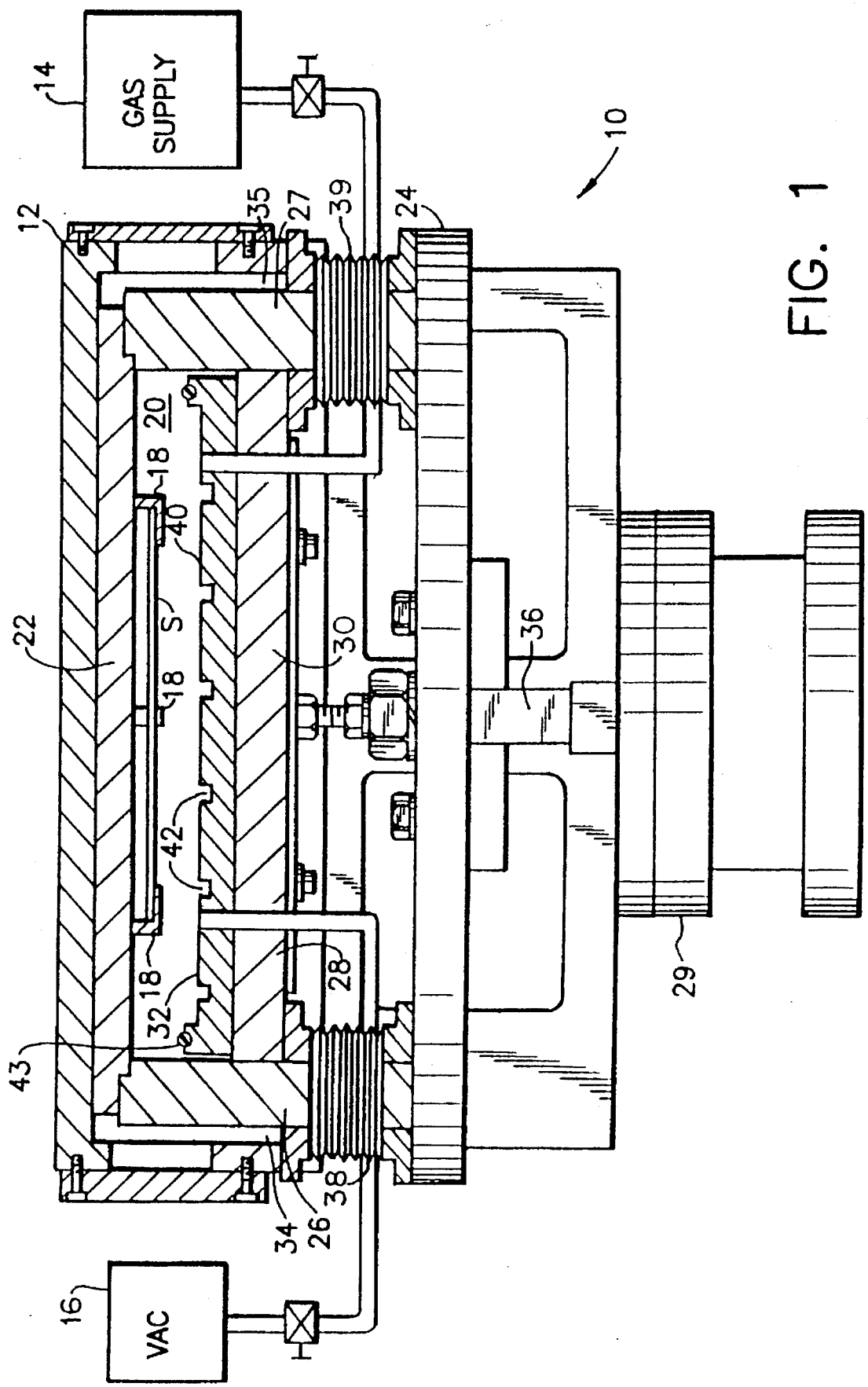
FIG. 1 is a schematic partial cross-sectional view of a thermal conditioning apparatus incorporating features of the present invention.

Referring to FIG. 1, there is shown a partial schematic cross-sectional view of a thermal conditioning apparatus 10 shown in the raised or open position incorporating features of the present invention. Although the present invention will be described with reference to the embodiments shown in the drawings, it should be understood that the present invention can be embodied in various different types and kinds of alternate embodiments. In addition, any suitable size, shape or type of elements or materials can be used.

The apparatus 10 generally comprises a chamber 12, a gas supply 14, and a source of vacuum 16. A similar thermal processing apparatus is disclosed in U.S. patent application Ser. No. 08/169,432 which is hereby incorporated by reference in its entirety. The chamber 12 is adapted to be connected to a substrate processing system, such as disclosed in U.S. Pat. No. 5,013,385 which is hereby incorporated by reference in its entirety. However, the apparatus 10 could be used in any suitable type of substrate processing system.

A top plate 22 is connected to a bottom plate 24 by two columns 26, 27. The top plate 22 includes supports 18 for holding the substrate S when the substrate S is loaded into and removed from the receiving area 20 of the chamber 12. The supports 18 extend down from the top plate 22. A thermal assembly 28 forms a bottom portion of the chamber 12. The thermal assembly 28 generally includes a heat transfer element 30 and a heat transfer plate 32. The heat transfer element 30 has two holes 34, 35 with the columns 26, 27 located therein. The heat transfer element 30 may be provided either as a heater, such as with heat lamps or heating coils, or as a cooler, such as with coolant conduits passing therethrough. A vertical drive mechanism 36 is connected to the bottom plate 24. The drive mechanism 36 is adapted to move the bottom plate 24 up and down relative to the chamber 12 and heat transfer plate 32. Because the columns 26, 27 are connected to the bottom plate 24, the columns 26, 27 are moved up and down with the bottom plate 24. Because the top plate 22 is connected to the columns 26, 27, the top plate 22 is moved up and down with the bottom plate 24. The top plate 22 may also contain a heater or cooler. Expandable seals 38, 39 surround the columns 26, 27 between the bottom plate 24 and the chamber 12.

Figure 2:
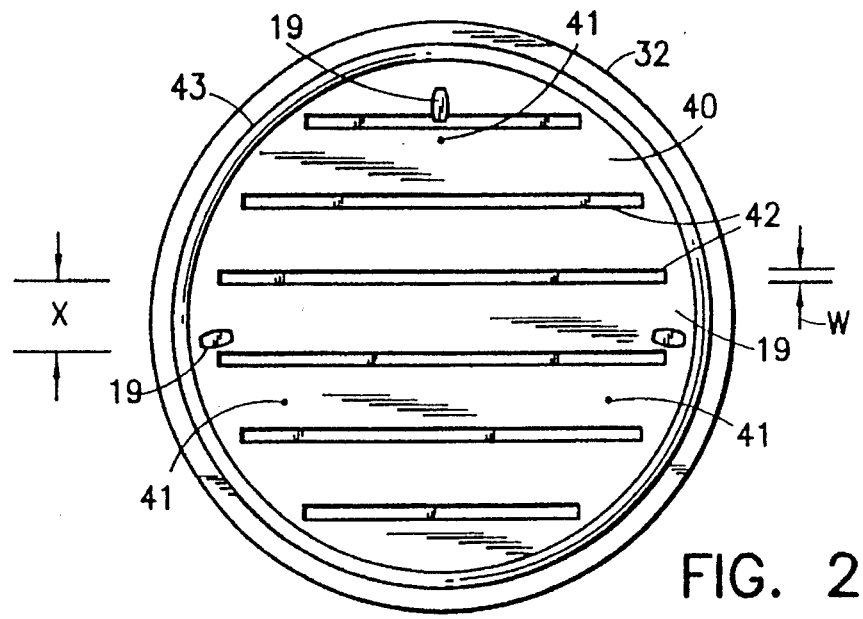
FIG. 2 is a plan top view of the heated/cooled plate of the apparatus shown in FIG. 1.
Figure 3:
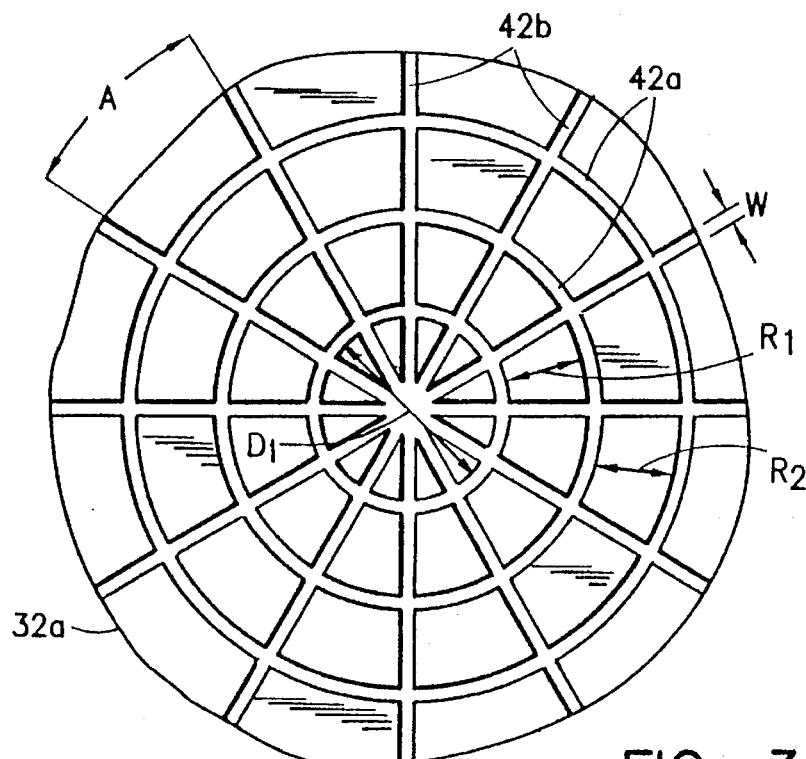
FIG. 3 is a partial plan top view of an alternate embodiment of the plate shown in FIG. 2.

The heat transfer plate 32 is connected on top of the heat transfer element 30. Referring also to FIG. 2, the heat transfer plate 32 is provided with a top surface 40 with three standoffs 41 that are adapted to contact and support the substrate S thereon. The standoffs 41 are very small to limit contact with the substrate S. The standoffs 41 are adapted to support the substrate S at a distance or gap of about 0.1 mm above the top surface 40. However, any suitable number or type of standoffs could be provided. In addition, any suitable gap could be provided, but the gap is preferably very small, such as about 0.05 mm to about 0.5 mm, depending on the size of the substrate, to provide viscous behavior of gas that is in the gap during heating or cooling. The top surface 40 has grooves 42 therealong. In the embodiment shown, the grooves 42 are parallel elongate slots. The grooves 42 have a width W of about 3 mm and a depth of about 2 mm. However, other dimensions could be provided. The grooves 42 are spaced from each other at a distance X of about 15 mm. However, other spacings could be provided. The plate 32 also has seats 19 for receiving the supports 18 on the top plate 22 when the top plate 22 is moved to its down position. Around the perimeter of the top surface 40 is a seal 43 for contacting the top plate 22 when it is moved to its down position and forming a seal between the top plate 22 and the heat transfer plate 32. FIG. 3 shows a partial plan top view of an alternate embodiment of a heat transfer plate 32a. The plate 32a has two sets of grooves; a first set of circular grooves 42a and a second set of straight grooves 42b. The two sets 42a, 42b intersect each other at general right angles. The diameter D, of the center circular groove is about 50 mm. The increase in radius $R_1$, $R_2$, etc. from the center circular groove to successive circular grooves is about 25 mm. The straight grooves are angled from each other at an angle A of about 30°. The width W of the grooves in both sets of grooves 42a, 42b is about 3 mm and the depth is about 2 mm. In alternate embodiments any suitable types or shapes of grooves could be provided.

The apparatus 10 can be adapted to either heat or cool the substrate S. The substrate S is inserted into the receiving area 20 onto supports 18 by a suitable substrate transport device (not shown). An entrance to the chamber 12 is closed when the transport device exits the chamber 12. The drive mechanism 36 then moves the top plate 22 down towards the heat transfer plate 32. The standoffs 41 contact the bottom side of the substrate S and lift the substrate S off of the supports 18. The bottoms of the supports 18 are received in the seats 19 in the plate 32. The top plate 22 contacts the seal 43 to thereby seal the substrate S between the top plate 22 and the heat transfer plate 32. This forms a sub-enclosure inside the receiving area 20. An inert gas, such as argon, is supplied to the sub-enclosure inside the receiving area 20 from the gas supply 14. The heat transfer element 30 either supplies heat to the plate 32 or removes heat from the plate 32.

In the embodiment where the heat transfer element 30 is a heater, heat is generated by the heater and conducted directly to the plate 32. The plate 32 transfers heat to the substrate by gas conduction. More specifically, the very small gap between the top surface 40 and the substrate S and the low gas pressure allow viscous behavior of the gas similar to liquid. This gas conduction heat transfer principle is described in U.S. patent application Ser. No. 08/145,343 which is hereby incorporated by reference in its entirety. After the substrate S is heated to its desired temperature, the inert gas in evacuated from the chamber 12 by the source of vacuum 16 and the drive mechanism 36 raises the top plate 22. The substrate S is returned to the supports 18 when the top plate is raised. The entrance to the chamber 12 is then opened and the transport device (not shown) removes the substrate from the chamber 12. The gas environment is used to promote heat transfer. The vacuum environment is used to help the substrate sustain its temperature. The vacuum environment is also beneficial in accelerating the filling of the sub-enclosure of the receiving area 20 with the gas.

In the embodiment where the heat transfer element 30 is a cooler, the heat transfer process is simply reversed with heat being transferred from the substrate S directly to the plate 32 at surface 40 by gas conduction. Coolant channels in the element 30 would be connected to a suitable heat exchanger, compressor, or heat pump (not shown) located outside the chamber 12.

One of the advantages of the present invention is that there is no backside or bottom vacuum pulling on the substrate S. Another advantage is that, although the pressure of the gas in the sub-enclosure of the receiving area 20 is reduced, the apparatus 10 still provides the same amount of heat transfer in the same amount of time as prior art devices. The heat transfer rate (conductivity) to or from a substrate was known to increase with an increase in pressure of the substrate against the heated/cooled plate in the device. However, subjecting the substrate to both increased pressure from gas in the receiving area and vacuum holding on the heated/cooled plate has been found to be undesirable. The present invention does not use either back pressure (vacuum holding) or top pressure (from pressurized gas) to force the substrate against the plate 32.

Figure 4:
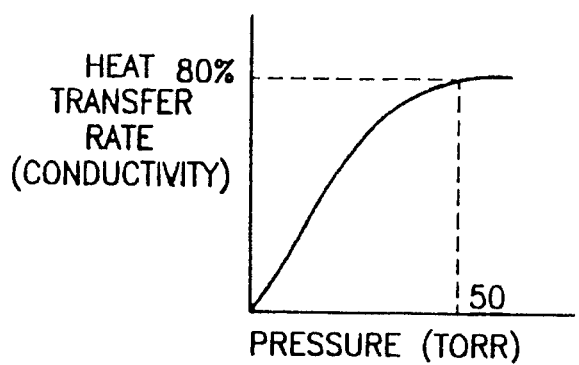
FIG. 4 is a graph of conductivity relative to pressure.

In a preferred embodiment, the sub-enclosure of the receiving area 20 has a pressure of about 50 Torr (about 0.1 atmosphere) when the gas is supplied and heat transfer occurs. As seen with reference to FIG. 4, conductivity in the apparatus 10 has been found to level off at about 80% of conductivity for 750 Torr (one atmosphere) when gas pressure reaches about 50 Torr. This low pressure allows the sub-enclosure of the receiving area 20 to be both filled and evacuated relatively quickly.

The grooves 42 are provided to allow quick transport of the gas into the gap between the substrate S and top surface 40. More specifically, because the gap is so small, such as about 0.1 mm, and the gas pressure is so low (about 50 Torr) it would take a relatively long time for gas to travel to the center of the substrate if the gas was only transported in the gap. The gas must be properly distributed for gas conduction to occur and to prevent pockets of gas to cause the substrate to move. Therefore, the grooves 42 are provided to function as a gas manifold to very quickly transport the gas throughout the entire area between the substrate and the top surface 40. Because the gas is distributed quickly into the gap, heating of the substrate can start sooner and there is less risk of damage to the substrate. However, in order to obtain optimum heat transfer, the grooves 42 preferably occupy 5% or less of the total area of the top surface 40.

Individualized control of the heating/cooling system is difficult because different types and sizes of substrates are sometimes conditioned by the same apparatus, and it is difficult to measure individual substrate temperatures accurately while the substrate is being heated or cooled. Substrates are also very sensitive to overheating. The present invention allows a more uniform and dependable heat transfer system by allowing the heating/cooling system to be kept at a relatively constant temperature. Because heat transfer in a vacuum is limited to radiation, which is very slow for temperature differences less than 300° C.–400° C., significant heat transfer between the substrate and the plate 32 does not occur until the gas is introduced into the sub-enclosure. Because of the grooves 42, the gas is quickly distributed to the entire area between the substrate and the top surface 40. This prevents unequal or non-uniform heat transfer. Thus, the substrate is heated/cooled uniformly and there is less risk of damage to the substrates due to their overheating sensitivity.

Figure 5:
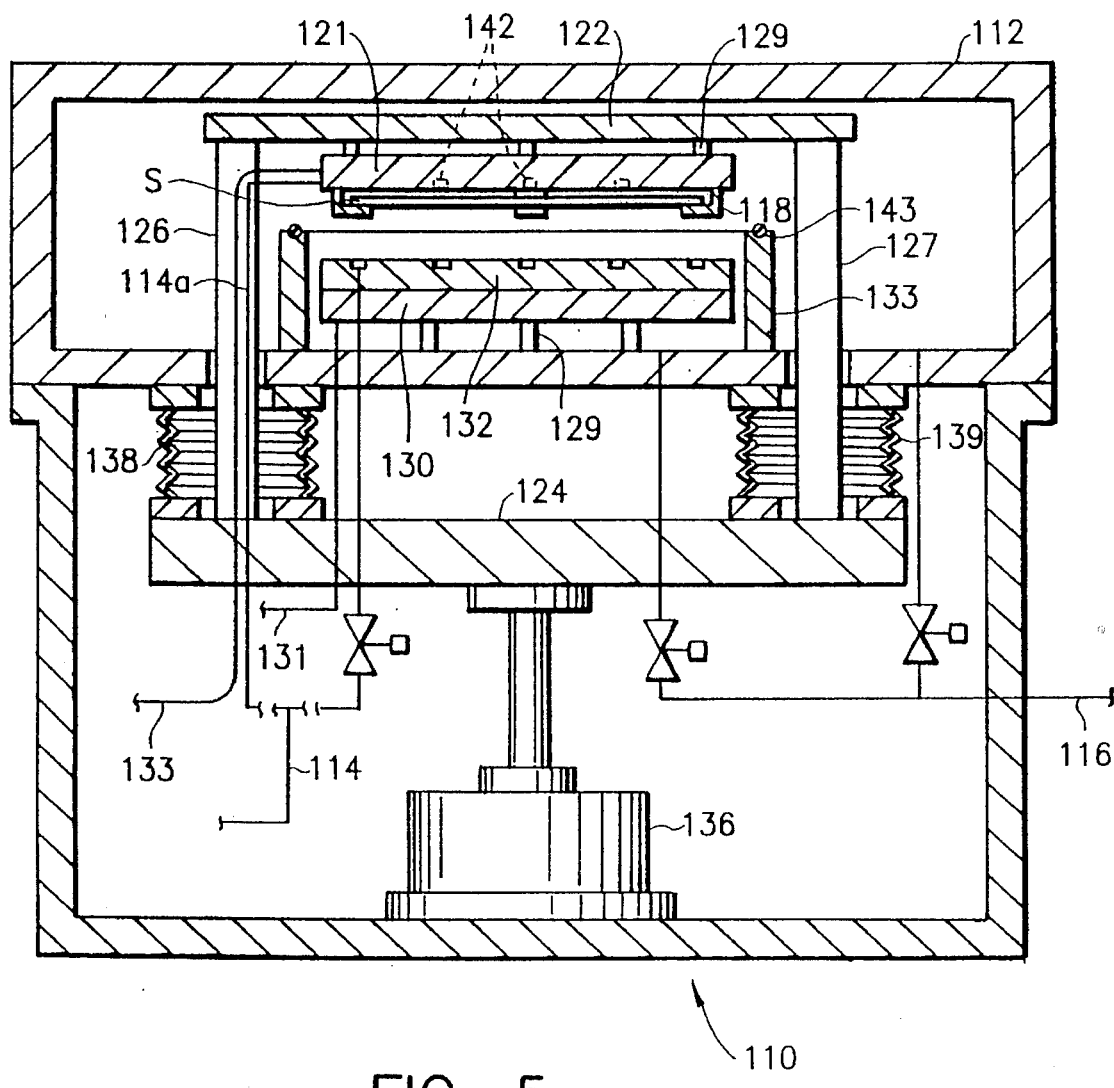
FIG. 5 is a schematic partial cross-sectional view of an alternate embodiment of the present invention.

Referring now to FIG. 5, an alternate embodiment of the present invention is shown. The apparatus 110 has a chamber 112, a gas supply 114, a source of vacuum 116, a vertical drive mechanism 136, two plates 122, 124, two columns 126, 127, and two heat exchange plates 121, 132. The bottom plate 124 is connected to the drive mechanism 136. The top plate 122 is connected to the bottom plate 124 by the columns 126, 127. The column 126, 127 extend through holes in the chamber 112. Expandable seals 138, 139 are provided around the columns 126, 127 between the bottom plate 124 and the chamber 112. The top heat exchange plate 121 is mounted to the underside of the top plate 122 by thermal isolation mounts 129. Supports 118 extend down from the bottom of the top heat exchanger 121 to support the substrate S. The top heat exchanger plate 121 can be supplied heat or coolant via line 133.

The bottom plate 124 is substantially similar to the plate 24 shown in FIG. 2. However, in this embodiment an enclosure 133 is provided that surrounds the bottom plate 124. The enclosure 133 has a bottom end that is connected to the chamber 112 and a top end with a seal 143. The bottom plate 132 is mounted on top of the bottom heat transfer element 130. The bottom element 130 is connected to a suitable heating or cooling source by line 131. Bottom element 130 is supported on the chamber 112 by thermal isolation mounts 129.

When the drive mechanism 136 moves the top plate 122 down from its open position shown in FIG. 5 to a closed position, the seal 143 is sandwiched between the top plate 122 and the enclosure 133. This forms the subenclosure inside the chamber 112. The substrate S is located on standoffs on the plate 132 with a small gap; such as about 0.1 mm, between the top surface of the plate 132 and the bottom of the substrate S. The apparatus 110 can use both heat exchanges 121, 132 to heat or cool the substrate S. This double sided heat transfer can increase the heat transfer rate. The double sided heat transfer also provides less likelihood of thermal distortion of the substrate S; as opposed to single side heat transfer. The resulting temperature gradient in a single side heat transfer system, due to uneven thermal stress between the two sides of the substrate S, could warp the substrate. Thus, the double sided heat transfer system of the present invention provides less likelihood of damage to the substrate S from uneven heating or cooling.

Preferably, the bottom surface of the top heat exchanger 121 is located very close to the top surface of the substrate S; such as with a gap of about 0.1 mm. Thus, gas conduction heat transfer can be provided by both the top and bottom heat transfer assemblies. The top heat exchange plate 121 could have grooves 142, similar to the grooves shown is FIGS. 2 and 3, to act as a gas transport manifold. The gas supply 114 could also be connected to top heat exchange plate 121, as shown by line 114a, to introduce gas above the substrate S.

In alternate embodiments, other pressures could be used. The present invention could also be used in a system that included vacuum holding of the substrate. Any suitable type of design of grooves could be provided. Any suitable type of heating and/or cooling system could be provided.

Any suitable type of gas supply and source of vacuum could also be provided. Any type of drive mechanism or movement mechanism could also be provided.

It should be understood that the foregoing description is only illustrative of the invention. Various alternatives and modifications can be devised by those skilled in the art without departing from the spirit of the invention. Accordingly, the present invention is intended to embrace all such alternatives, modifications and variances which fall within the scope of the appended claims.

What is claimed is:

1. An apparatus for changing temperature of a substantially planar substrate, the apparatus comprising:
   a chamber;
   a plate located in the chamber, the plate having a top surface with grooves therealong, the top surface having means for supporting a substrate thereon with a small gap between the substrate and the top surface;
   means for introducing a gas into the chamber; and
   means for heating the plate, wherein heat is transferred between the top surface of the plate and the substrate by gas conduction.

2. An apparatus as in claim 1 wherein the grooves are elongate parallel grooves.

3. An apparatus as in claim 1 wherein the grooves are about 3 mm wide and about 2 mm deep.

4. An apparatus as in claim 1 wherein the grooves include intersecting grooves.

5. An apparatus as in claim 1 wherein the gap is about 0.1 mm.

6. An apparatus as in claim 1 further comprising means for evacuating the gas from the chamber.

7. In an apparatus for changing temperature of a planar substrate, the apparatus having a substrate receiving chamber, a plate located in the chamber having a heat transfer surface, and means for controlling the temperature of the plate, the improvement comprising:
   the heat transfer surface of the plate having grooves therealong to quickly distribute gas between the plate and a substrate located on the plate in very close proximity thereto for gas conduction.

8. An apparatus as in claim 7 wherein the grooves includes first elongate grooves.

9. An apparatus as in claim 8 wherein the grooves includes second circular grooves intersecting the first elongate grooves.

10. A method of transferring heat between a planar substrate and a plate in a thermal conditioning apparatus, the method comprising steps of:
    placing the substrate on the plate in a chamber of the apparatus, the plate having a heat transfer surface with the grooves therealong and standoffs for holding the substrate at a spaced distance from the heat transfer surface, the spaced distance being about 0.05 mm to about 0.5 mm;
    introducing gas into the chamber, the gas being quickly distributed through the grooves to the entire area between the substrate and the heat transfer surface; and
    transferring heat between the plate and the substrate by gas conduction.

11. A method as in claim 10 wherein the step of transferring heat comprises the plate heating the substrate through gas conduction.

12. A method as in claim 10 wherein the step of transferring heat comprises the substrate heating the plate through gas conduction.

* * * * *